United States Patent [19]
Macey

[11] 4,021,684
[45] May 3, 1977

[54] PUSH-PULL POWER AMPLIFIER

[75] Inventor: Frank G. Macey, Shrewsbury, Mass.

[73] Assignee: GTE Sylvania Incorporated, Stamford, Conn.

[22] Filed: Oct. 14, 1975

[21] Appl. No.: 621,642

[52] U.S. Cl. .............................. 307/268; 307/300; 330/13; 330/28; 330/110
[51] Int. Cl.² .......................................... H03K 5/01
[58] Field of Search ................ 330/13, 15, 17, 28, 330/84, 110, 207 A; 307/300, 268

[56] References Cited
UNITED STATES PATENTS

| | | | |
|---|---|---|---|
| 3,421,099 | 1/1969 | O'Malley | 330/15 |
| 3,448,395 | 6/1969 | Webb | 330/15 X |
| 3,526,845 | 9/1970 | Sikorra | 330/13 X |

Primary Examiner—James B. Mullins
Attorney, Agent, or Firm—David M. Keay; Elmer J. Nealon; Norman J. O'Malley

[57] ABSTRACT

Symmetrical push-pull power amplifier employing a pair of complementary output transistors having their collectors connected to an output terminal. The output transistors are each driven by an associated input transistor of the opposite conductivity type. Feedback diodes are coupled between the collector of each output transistor and the input of the input transistor associated with the other output transistor. A feedback diode is forward biased while the output transistor to which it is coupled is conducting, thus biasing to nonconduction the input transistor to which it is coupled. Therefore, when the polarity of the input signal to the input transistors changes, the output transistor that is off is not turned on until the output transistor that is on has dissipated the charge stored therein and is not conducting.

1 Claim, 2 Drawing Figures

PUSH-PULL POWER AMPLIFIER

BACKGROUND OF THE INVENTION

This invention relates to push-pull power amplifier circuits. More particularly, it is concerned with transistorized push-pull amplifier circuits having compensation for turn-off delays caused by transistor charge storage.

Complementary transistor push-pull power amplifiers for providing a squarewave drive output are well-known. The output power transistors typically operate alternately in saturation. However, there is a delay in turning a transistor off because of the charge which becomes stored in the transistor when it operates in saturation. Thus when a transistor is turned on, the other transistor remains conductive due to the stored charge and both output transistors are on at the same time for a portion of each cycle. A large surge current is drawn from the power source and the power dissipation of the circuit is greatly increased. Also there is the possibility of hot spots developing in the transistors or that the transistors will fail due to secondary breakdown.

Various techniques have been developed to avoid the problem of charge storage delay in turning off the output transistors of push-pull amplifiers. In one arrangement the output transistors are transformer coupled. In another arrangement base biasing networks are used to sweep out the stored collector-base charge by the rapid application of a reverse bias to the base electrodes of the output transistors. The base biasing networks require the use of additional bias voltages and also consume additional power thereby reducing the efficiency of the circuit. In addition, neither of these two techniques completely eliminates simultaneous conduction in the output transistors over a wide range of output loads.

In another technique a fixed delay is introduced into the turn-on time of each transistor by the use of resistance-capcitance time constants or digital delay circuits. However, a fixed delay limits the circuit to narrow range of operating frequencies and to a constant load since the turn-off delay, assuming a fixed drive level to the output transistor, varies inversely with the output load.

SUMMARY OF THE INVENTION

Push-pull power amplifier circuits for preventing simultaneous operation of the two output transistors over a wide range of frequencies variations in output loads is provided by a push-pull amplifier circuit in accordance with the present invention. The circuit includes an input terminal for receiving an input drive signal and an output terminal. A first transistor means has its input coupled to the input terminal and its output coupled to the output terminal and a second transistor means also has its input coupled to the input terminal and its output coupled to the output terminal. A feedback means is coupled to the output terminal and to the inputs of the first and second transistor means. The feedback means operates when the first transistor means is conducting to bias the second transistor means to nonconduction and also operates when the second transistor means is conducting to bias the first transistor means to nonconduction.

The first transistor means is biased to conduction by the presence of a signal of one polarity at the input terminal unless the feedback means is biasing the first transistor means to nonconduction. The second transistor means is biased to conduction by the presence of a signal of the opposite polarity at the input terminal unless the feedback means is biasing the second transistor means to nonconduction. Thus, when the input signal present at the input terminal changes from the one polarity to the opposite polarity the second transistor means is not biased to conduction until conduction terminates in the first transistor means. Also when the input signal present at the input terminal changes from the opposite polarity to the one polarity the first transistor means is not biased to conduction until conduction terminates in the second transistor means. Therefore, the turn-off delay caused by the stored charge in each transistor means is compensated for regardless of variations in the delay under different conditions of input signal frequency or output load.

BRIEF DESCRIPTION OF THE DRAWINGS

Additional objects, features, and advantages of push-pull power amplifier circuits in accordance with the present invention will be apparent from the following detailed discussion together with the accompanying drawings wherein.

DETAILED DESCRIPTION OF THE INVENTION

Figure 1:
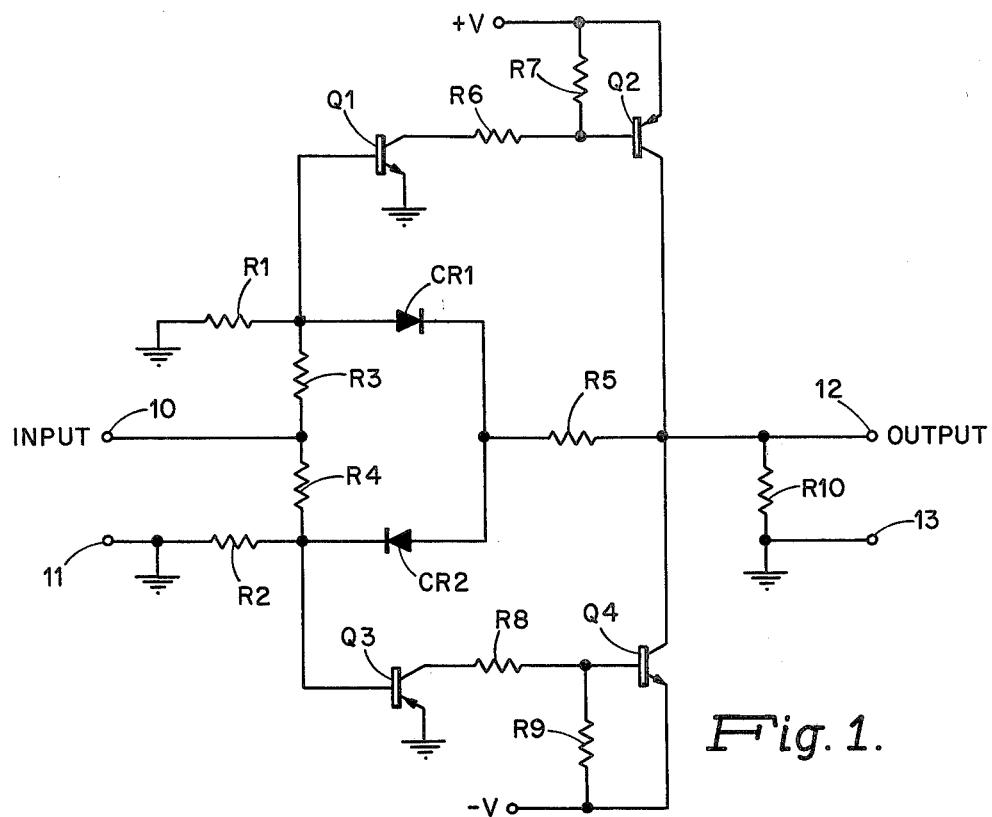
FIG. 1 is a schematic circuit diagram of a push-pull power amplifier in accordance with the present invention.

FIG. 1 illustrates a specific embodiment of a symmetrical push-pull amplifier in accordance with the present invention. The circuit is driven by an INPUT signal of squarewave pulses which alternate between +3 volts and −3 volts applied across the input terminals 10 and 11. The OUTPUT signal between terminals 12 and ground 13 alternates between +7 and −7 volts.

The input terminal 10 of the circuit of FIG. 1 is connected through a resistance R3 to the base of an NPN input transistor Q1. The other input terminal 11 is connected to ground. The base of the input transistor Q1 is also connected through a resistance R1 to ground. The emitter of transistor Q1 is also connected to ground and its collector is connected through resistances R6 and R7 to a positive voltage source +V. The juncture of resistances R6 and R7 is connected to the base of a PNP power output transistor Q2. The emitter of transistor Q2 is also connected directly to the +V voltage source. The collector of the power output transistor Q2 is connected directly to the output terminal 12.

The input terminal 10 is also connected through a resistance R4 to the base of a PNP input transistor Q3. The base of input transistor Q3 is also connected through a resistance R2 to ground. The emitter of transistor Q3 is also connected to ground and its collector is connected through resistances R8 and R9 to a negative voltage source −V. The juncture of resistances R8 and R9 is connected to the base of an NPN power output transistor Q4. The emitter of transistor Q4 is connected directly to the −V voltage source and the collector of transistor Q4 is connected to the output terminal 12. A resistance R10 is connected between the output terminal 12 and ground. The other output terminal 13 is connected to ground.

The foregoing arrangement is a complementary transistor push-pull power amplifier of generally well-known type. In accordance with the present invention, the circuit also includes feedback circuitry from the output terminal 12, or the collectors of the two output transistors Q2 and Q4, to the input transistors Q1 and Q3. The feedback circuitry includes a resistance R5 connected to the output terminal 12 and two diodes CR1 and CR2 connected in parallel and in opposite polarity. Diode CR1 is connected between the resistance R5 and the base of input transistor Q1 in such a way that the diode CR1 is forward biased when the voltage at the output terminal 12 is negative with respect to the voltage at the base of transistor Q1. The other diode CR2 is connected between resistance R5 and the base of transistor Q3 with the polarity arranged so that the diode is forward biased when the voltage at the output terminal 12 is positive with respect to the voltage at the base of input transistor Q3.

In the specific embodiment under discussion the voltage of the +V voltage source is −7.5 volts and the voltage of the −V voltage source is +7.5 volts. The amplifier circuit of FIG. 1 operates when an input signal of +3 volts is present at the input terminal 10 to cause the NPN input transistor Q1 and consequently its associate PNP power output transistor Q2 to operate in saturation. The resulting output voltage at the output terminal 12 is approximately +7 volts. When the voltage at the input terminal 10 is −3 volts, PNP input transistor Q3 and consequently its associated NPN power output transistor Q4 operate in saturation producing a −7 volt output signal.

In a typical embodiment of a push-pull amplifier circuit as described when the circuit is driving loads of less than 200 milliamperes, the output transistors remain in conduction for up to 2 microseconds after their base drive has been terminated. Thus, for a 100 KHz square wave input signal both output transistors tend to be on at the same time for 4 microseconds of every 10 microsecond cycle. The feedback circuit of the amplifier in accordance with the present invention prevents simultaneous operation of both output transistors by insuring that an output transistor is not turned on until the other output transistor has turned off regardless of the amount of delay caused by stored charge.

Figure 2:
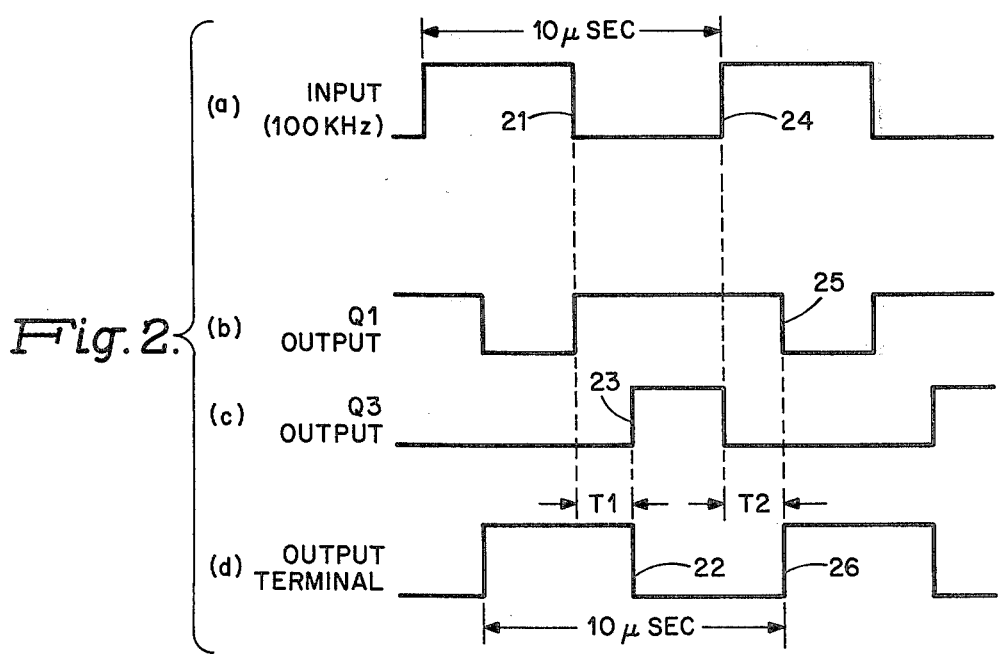
FIG. 2 illustrates curves of voltage at various points in the circuit of FIG. 1 during operation of the circuit.

FIG. 2 illustrates the manner in which the circuit of FIG. 1 operates in response to a squarewave input signal of 100 KHz, curve (a). During a positive portion of the input signal the output as shown in curve (d) is also positive. On the transition 21 of the input signal from positive to negative, input transistor Q1 which was in saturation turns off as indicated in curve (b). However, by virtue of the charge stored in the collector-base junction of the associated power output transistor Q2 there is a delay T1 of approximately 2 microseconds between the time the input transistor Q1 ceases to provide base drive to transistor Q2 and transistor Q2 stops conducting. Not until the end of the delay T1 does the voltage at the output terminal 12 decrease as illustrated by the transition 22 in curve (d) of FIG. 2.

During the delay period T1, the input signal, curve (a), is negative tending to bias the PNP input transistor Q3 to conduction. However, since the PNP output transistor Q2 is conducting and the voltage at its collector and at the output terminal 12 is positive, diode CR2 of the feedback circuit is forward biased. A relatively high positive voltage is thereby produced at the base of PNP input transistor Q3. Thus, input transistor Q3 is biased in the nonconducting condition despite the negative voltage at the input terminal 10 and output transistor Q4 remains off.

When the stored charge in output transistor Q2 has been depleted and transistor Q2 turns off, the voltage at the output terminal 12 descreases as illustrated by transition 22 of curve (d). Diode CR2 is no longer forward biased and the voltage at the base of input transistor Q3 bcomes negative by virtue of the applied input voltage. Transistor Q3 conducts as indicated by the transition 23 of curve (c) providing base current to its associated output transistor Q4. Output transistor Q4 operates in saturation producing a negative voltage at the output terminal 12 as shown in curve (d). Thus, the feedback arrangement serves to prevent transistor Q4 from being turned on until transistor Q2 has ceased conduction regardless of the length of the delay T1 required to dissipate the stored charge in output transistor Q2.

On the transition 24 of the input signal from negative to positive PNP input transistor Q3 is turned off as shown in curve (c). However, due to the charge stored in the collector-base junction of the saturated output transistor Q4, that transistor does not turn off until after a delay T2 of approximately 2 microseconds. During this period diode CR1 of the feedback arrangement is forward biased and a negative voltage is established at the base of input transistor Q1. This voltage is sufficient to overcome the effects of the positive input signal applied at the input terminal 10, thus maintaining NPN input transistor Q1 and its associated output transistor Q2 turned off.

At the end of the period T2 when the charge stored in output transistor Q4 has been used up, the voltage at the output terminal 12 rises and the diode CR1 is no longer forward biased. The positive input voltage at the input terminal 10 turns input transistor Q1 and consequently output transistor Q2 on as shown by transitions 25 of curve (b) and 26 of curve (d). Again, the feedback arrangement has prevented output transistor Q2 from turning on until output transistor Q4 is off regardless of the length of delay T2 for dissipating the charge stored in the output transistor Q4.

A specific embodiment of the push-pull amplifier circuit illustrated in FIG. 1 was fabricated employing the components as listed below:

| Q1  | 2N2219 | R1 | 68Ω  | R7  | 10Ω        |
|-----|--------|----|------|-----|------------|
| Q2  | 2N3792 | R2 | 68Ω  | R8  | 22Ω        |
| Q3  | 2N2905 | R3 | 82Ω  | R9  | 12Ω        |
| Q4  | 2N3716 | R4 | 82Ω  | R10 | 43Ω        |
| CR1 | 1N4148 | R5 | 300Ω | +V  | +7.5 volts |
| CR2 | 1N4148 | R6 | 22Ω  | −V  | −7.5 volts |

The circuit operated without causing simultaneous operation of the two output power transistors over a range of input signal frequencies from DC to 500 KHz. Full compensation of the turnoff delay due to transistor charge storage was obtained for loads up to 2 amperes. The circuit dissipated 1.6 watts when driving a 1 ampere load.

While there has been shown and described what is considered a preferred embodiment of the present invention, it will be obvious to those skilled in the art that various changes and modifications may be made therein without departing from the invention as defined by the appended claims.

What is claimed is:

1. A push-pull amplifier circuit comprising
an input terminal for receiving an input signal;
an output terminal;
first transistor means having its input coupled to said input terminal and its output coupled to said output terminal;
said first transistor means including
   a first output transistor of one conductivity type having its collector connected directly to said output terminal and its emitter connected to a voltage source of one polarity, and
   a first input transistor of the opposite conductivity type having its base coupled to the input terminal and its collector coupled to the base of the first output transistor;
said first transistor means being biased to conduction when the voltage at its input is of one polarity and being biased to nonconduction when the voltage at its input is of the opposite polarity;
second transistor means having its input coupled to said input terminal and its output coupled to said output terminal;
said second transistor means including
   a second output transistor of the opposite conductivity type having its collector connected directly to said output terminal and its emitter connected to a voltage source of the opposite polarity, and
   a second input transistor of the one conductivity type having its base coupled to the input terminal and its collector coupled to the base of the second output transistor;
said second transistor means being biased to conduction when the voltage at its input is of said opposite polarity and being biased to nonconduction when the voltage at its input is of said one polarity; and
feedback means including
   a first diode having a first terminal connected to the base of said second input transistor and having a second terminal,
   a second diode having a first terminal connected to the base of said first input transistor and having a second terminal connected to the second terminal of said first diode, and
   a resistance connected between the second terminals of said first and second diodes and said output terminal,
   said first diode being connected between said output terminal and the base of said second input transistor so as to be forward biased when the first output transistor is conducting, and
   said second diode being connected between said output terminal and the base of said first input transistor so as to be forward biased when the second output transistor is conducting;
said feedback means being operable when the first transistor means is conducting to produce a voltage of the one polarity at the input of the second transistor means and being operable when the second transistor means is conducting to produce a voltage of the opposite polarity at the input of the first transistor means;
said first transistor means being biased to conduction by the presence of a signal of the one polarity at the input terminal unless the feedback means is producing a voltage of the opposite polarity at the input of the first transistor means; and
said second transistor means being biased to conduction by the presence of a signal of the opposite polarity at the input terminal unless the feedback means is producing a voltage of the one polarity at the input of the second transistor means;
whereby when the input signal present at the input terminal changes from the one polarity to the opposite polarity said second transistor means is not biased to conduction until conduction terminates in the first transistor means, and when the input signal present at the input terminal changes from the opposite polarity to the one polarity said first transistor means is not biased to conduction until conduction terminates in the second transistor means.

* * * * *